(12) United States Patent
Mitsutani (10) Patent No.: US 6,337,650 B1
(45) Date of Patent: Jan. 8, 2002

(54) SYSTEM AND METHOD FOR REGENERATING CLOCK SIGNAL

(75) Inventor: Naoki Mitsutani, Tokyo (JP)

(73) Assignee: NEC Corporation, Tokyo (JP)

(*) Notice: Subject to any disclaimer, the term of this patent is extended or adjusted under 35 U.S.C. 154(b) by 21 days.

(21) Appl. No.: 09/588,695

(22) Filed: Jun. 7, 2000

(30) Foreign Application Priority Data

Jun. 7, 1999 (JP) ............................................ 11-158989

(51) Int. Cl.[7] .............................................. H03M 1/12
(52) U.S. Cl. ..................................................... 341/155
(58) Field of Search ............................... 341/155, 118, 341/115, 126

(56) References Cited

U.S. PATENT DOCUMENTS 6,232,905 B1 * 5/2001 Smith ........................ 341/155

* cited by examiner

Primary Examiner—Brian Young
(74) Attorney, Agent, or Firm—Sughrue Mion, PLLC (57) ABSTRACT

A clock-signal regenerating system for regenerating a clock signal by feeding back a phase difference between a demodulated analog data signal and a clock signal includes: an A/D converter for over-sampling the demodulated analog data signal to convert it into a digital signal; a data-change-direction detecting circuit for deciding a change in data sampled at its peak positions, to detect whether the data changed in an ascending direction or a descending direction; a threshold selecting circuit for holding a threshold and deciding a positive/negative sign of data sampled at its zero-crossing positions, to select the threshold; a phase-difference detecting circuit for comparing the data of the demodulated analog data signal sampled at the zero-crossing position to the selected threshold, to detect sampled data in excess of the threshold as a phase difference; and a multiplier for multiplying thus detected phase difference by data in thus detected data-change direction, to obtain a resultant phase difference.

9 Claims, 5 Drawing Sheets

SYSTEM AND METHOD FOR REGENERATING CLOCK SIGNAL

BACKGROUND OF THE INVENTION

1. Field of the Invention

The present invention relates to a system and a method for regenerating a stable clock signal for a semi-synchronization type digital demodulating apparatus used in satellite communication, and more particularly to the system and the method for regenerating the stable clock signal with a reduced jitter component.

2. Description of the Related Art

There have conventionally been proposed the above-mentioned type of various clock-signal regenerating systems for use in a semi-synchronization type digital demodulating apparatus. Of these, such a system is known that over-samples a change point in demodulated analog data using an analog/digital (A/D) converter and then adjusts that data's sampling timing using a PLL (Phase Lock Loop).

Figure 3:
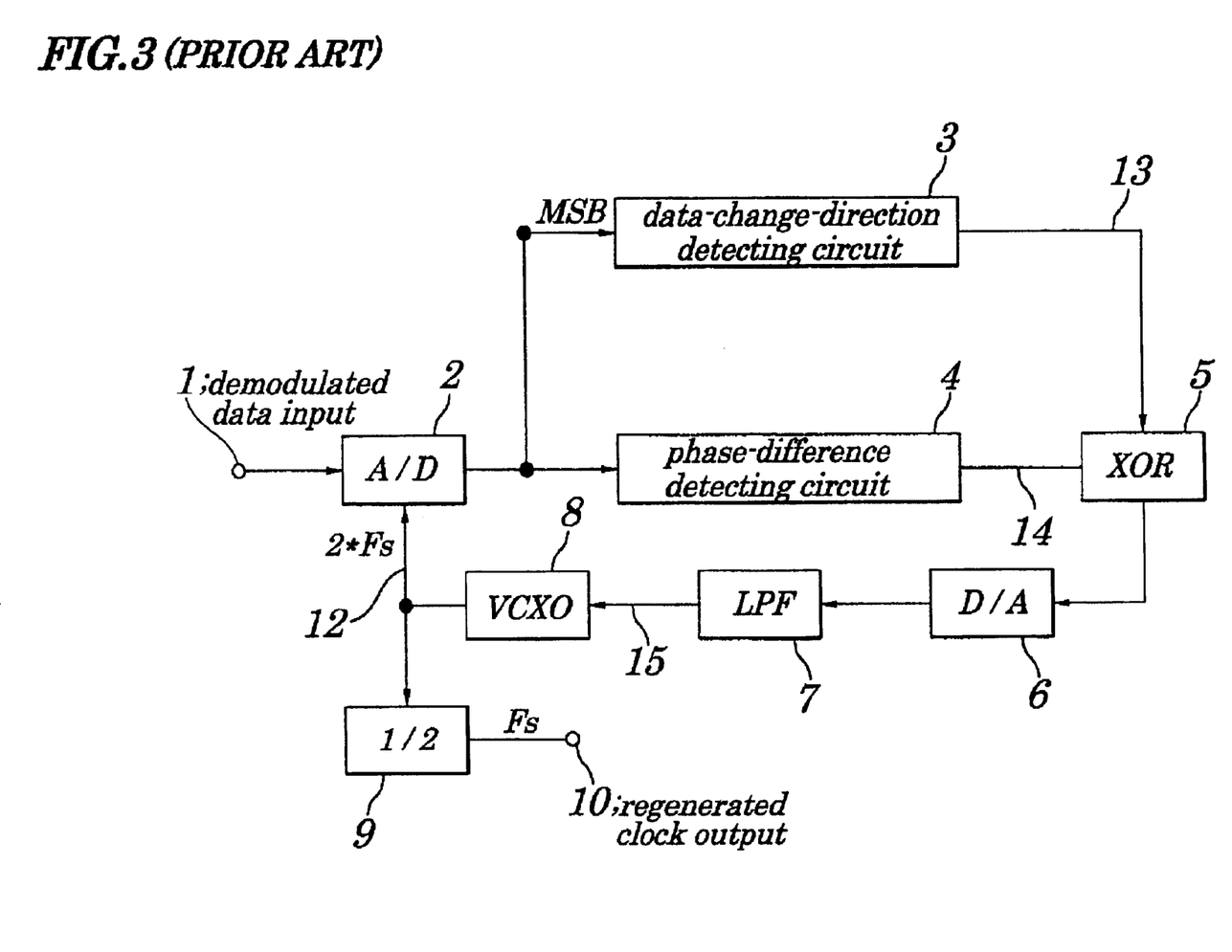
FIG. 3 is a block diagram showing a conventional clock-signal regenerating system.

Note here that throughout the following drawings, same components are indicated by same reference symbols and numerals. As shown in FIG. 3, at an input terminal 1 to which is input an demodulated analog data signal with a symbol frequency Fs, an A/D converter 2 is connected, which converts the demodulated analog data signal into a digital signal.

To the A/D converter 2 is connected a voltage-controlled oscillator (VCXO) 8, which outputs a clock signal 12 having a sampling frequency (2* Fs) twice as high as the symbol frequency (Fs) to the A/D converter 2.

The A/D converter 2 is in turn connected to a data-change-direction detecting circuit 3, which receives a most significant bit (MSB) converted at the AID converter 2 to detect a data-change direction of the above-mentioned demodulated analog data and then output a data-change-direction signal 13. Since information of the data-change direction is enough to tell whether the demodulated analog data changed from +1→−1 or −1→+1 in direction, not all bits but only a most significant bit is required to make a decision of that direction.

The A/D converter 2 is also connected to a phase-difference detecting circuit 4, which detects a phase difference between a clock signal 12 of the voltage-controlled oscillator 8 and demodulated analog data at the input terminal 1, and outputs a phase-difference signal 14.

To the data-change-direction detecting circuit 3 and the phase-difference detecting circuit 4 is connected a multiplier (XOR) 5, which multiplies the phase-difference signal 14 from the phase-difference detecting circuit 4 by the data-change-direction signal 13 from the data-change-direction detecting circuit 3, and outputs a resultant phase-difference signal including information of phase lag and lead.

To the multiplier 5 is connected a digital/analog (D/A) converter 6, which converts a digital output signal from the multiplier 5 into an analog signal.

To the D/A converter 6 is connected a low-pass filter (LPF) 7, which removes a high-frequency component from an output signal of the D/A converter 6 and outputs the resultant phase control signal to the voltage-controlled oscillator 8, to control the voltage-controlled oscillator 8 so as to synchronize in phase the above-mentioned demodulated analog data with the clock signal 12.

To the voltage-controlled oscillator 8 is connected a frequency divider 9, which divides to ½ the frequency of a signal obtained by thus phase-synchronizing the above-mentioned demodulated analog data and the clock signal 12 and then output thus regenerated clock signal at an output terminal 10.

Figure 4:
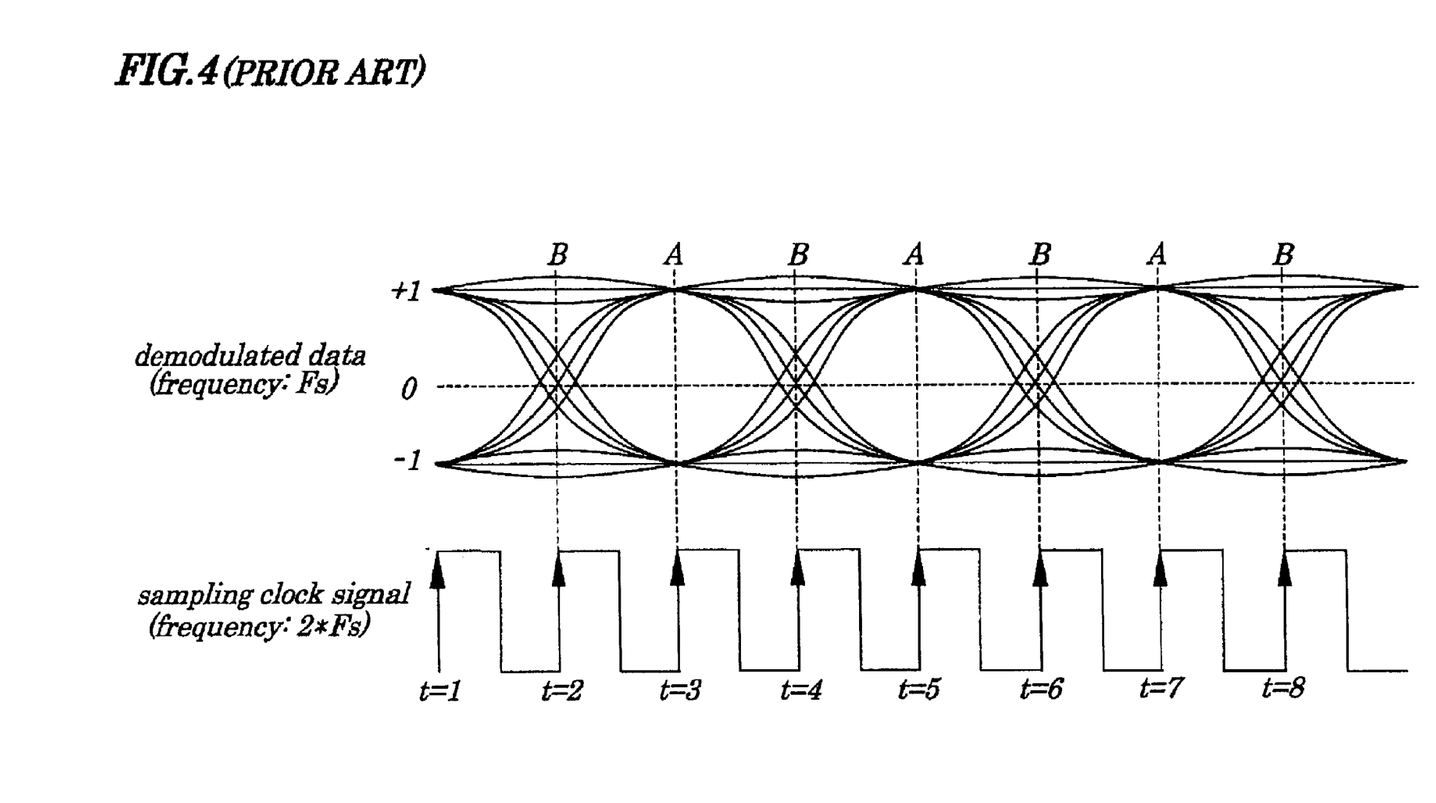
FIG. 4 is a timing chart explaining timing for sampling a clock signal at an A/D converter of the conventional clock-signal regenerating system of FIG. 3.

As shown at the upper part of FIG. 4, the demodulated analog data is input at the input terminal 1, to form an eye pattern which is the analog signal with the frequency Fs and also which changes in amplitude between two peak positions of "+1" and "−1."

As shown at a lower part of the FIG. 3, the clock signal 12 sent from the voltage-controlled oscillator 8 to the A/D converter 2 has, as mentioned above, a sampling frequency of 2* Fs, so that double over-sampling is performed at the A/D converter 2.

At the A/D converter 2, as shown in the FIG. 3, data is sampled at two points, on a rising edge of the clock signal 12, of one data convergence point of timing A and an other data convergence point (zero-crossing point) of timing B. That is, the timing A is a peak position of the demodulated analog data and the timing B, the zero-crossing point thereof.

Next, an example of operations of the data-change-direction detecting circuit 3 is explained as follows. The data-change-direction detecting circuit 3 uses only the MSB of the demodulated analog data sampled by the A/D converter 2 and also the data present at the sampling timing A shown in FIG. 4, to detect the data-change direction.

That is, although the MSBs of the demodulated analog data sampled at the timing points A and B shown in FIG. 4 are input to the data-change-direction detecting circuit 3, it can detect the data-change direction using only the demodulated analog data that was sampled at the timing A.

Since a center voltage (DC offset voltage) of the demodulated analog data input to the A/D converter 2 is aligned with a center of an input range for the A/D converter 2, peak positions "+1" and "−1" of the demodulated analog data can be decided using only the MSB of the data sampled at the timing A.

The data-change-direction detecting circuit 3 uses two consecutive data pieces sampled at the timing A shown in FIG. 4, to detect a change in the peak position of the demodulated analog data from "+1" to "−1" or vice versa. For example, the data-change-direction detecting data-change-direction detecting circuit 3 compares the MSB of the data sampled at t=1 to that at t=3, then that at t=3 to that at t=5, and then that at t=5 to that at t=7, and so on, respectively.

When the data-change-direction detecting circuit 3 decides, based on this comparison, that the demodulated analog data changed from its peak positions of "−1" to "+1," it outputs "+1" as the data-change direction signal 13. When the data-change-direction detecting circuit 3 decides a change of the demodulated analog data from its peak positions "+1" to "−1," it outputs "−1" as the data-change direction signal 13.

If the demodulated analog data stays unchanged, for example, as from "−1" to "−1" or from "+1" to "+1," the data-change-direction detecting circuit 3 outputs "0" as the data-change-direction signal 13.

Next, an example of operations of the phase-difference detecting circuit 4 is described as follows. The phase-difference detecting circuit 4 in turn receives demodulated analog data sampled at the timing points A and B, of which the data sampled at the timing B is used to detect the phase difference between the clock signal 12 and the demodulated analog data as follows.

Figure 5A:
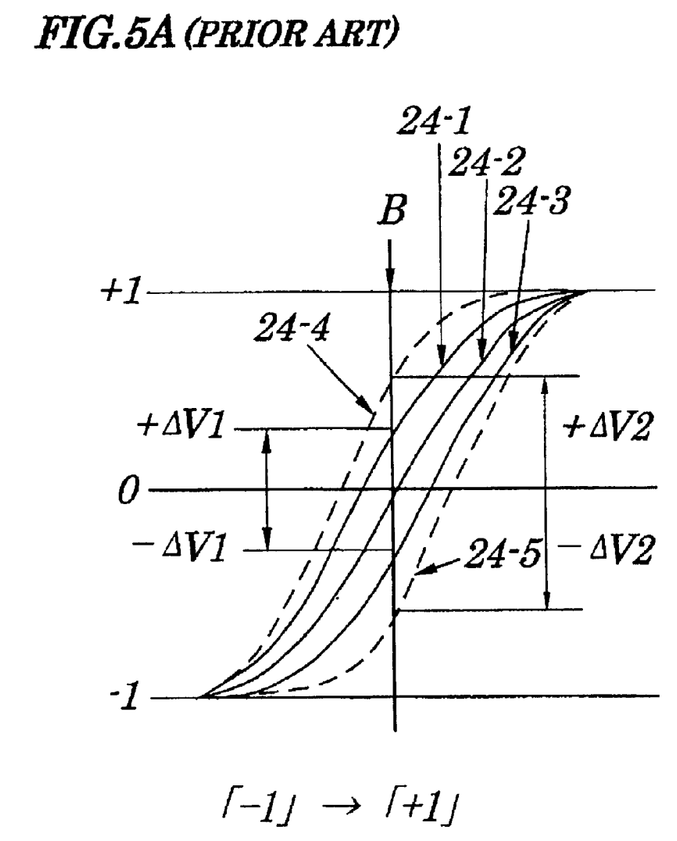
FIGS. 5A and 5B are graphs explaining operations of detecting a phase difference by a phase-difference detecting circuit at the timing shown in FIG. 4.

When, as shown in FIG. 5A, demodulated analog data is changed in its peak position from "−1" to "+1," changes in the demodulated analog data of waveforms (24-1), (24-2), and (24-3) indicate a state where phase synchronization is established between the clock signal 12 and the demodulated analog data, while changes of the demodulated analog data of waveforms (24-4) and (24-5) indicate the state where that synchronization is not established therebetween.

Figure 5B:
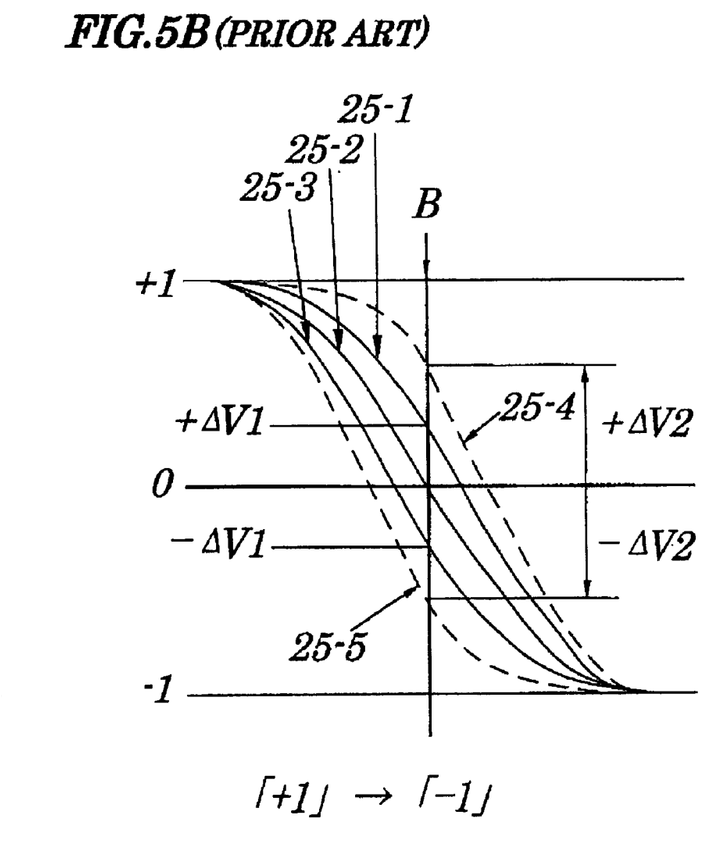

Likewise, as shown in FIG. 5B, when demodulated analog data changed in its peak position from "+1" to "−1," changes in the demodulated analog data of waveforms (25-1), (25-2), and (25-3) indicate the state where phase synchronization is established between the clock signal 12 and the demodulated analog data, while changes in the demodulated analog data of waveforms (25-4) and (25-5) indicate the state where synchronization is not established therebetween.

As shown in FIG. 5A, the prior-art phase-difference detecting circuit 4 detects, with respect to the zero-crossing position, the phase difference of ±ΔV1 for the change of the demodulated analog data of the waveforms (24-1) and (24-3) and that of ±ΔV2 (ΔV2>ΔV1) for a change of the demodulated analog data of the waveforms (24-4) and (24-5).

Moreover, as shown in FIG. 5B, the prior-art phase-difference detecting circuit 4 detects, with respect to the zero-crossing position, the phase difference of ±ΔV1 for the change in the demodulated analog data of waveforms (25-1) and (25-3) and that of ±ΔV2 for the change of the demodulated analog data of waveforms (25-4) and (25-5).

Conventionally, these phase differences of ±ΔV1 and ±ΔV2 have been used for feedback in a loop formed by the multiplier 5, the D/A converter 6, the low-pass filter 7, and the voltage-controlled oscillator 8.

Note here that it is appropriate to use the phase difference of ±ΔV2 for the above-mentioned changes of the demodulated analog data of the waveforms (24-4) and (24-5) and those of the demodulated analog data of the waveforms (25-4) and (25-5), because that demodulated analog data actually has the phase shift as against the clock signal 12. However, it is not appropriate to use the phase difference ±ΔV1 for the above-mentioned changes of the demodulated analog data of the waveforms (24-1) and (24-3) and those of the demodulated analog data of the waveforms (25-1) and (25-3), because that demodulated analog data actually has no phase shift as against the clock signal 12.

This is because that if the phase difference of ±ΔV1 is used for the changes of the demodulated analog data of the waveforms (24-1) and (24-3) or those of the waveforms (25-1) and (25-3), it may cause the clock signal 12 to jitter.

To remove this jitter, the low-pass filter 7 must have a reduced band width. If the band width of the low-pass filter is reduced, however, fluctuations in original phase difference cannot accurately be tracked, thus leading to a problem that regeneration accuracy of the clock signal 12 cannot be improved.

SUMMARY OF THE INVENTION

In view of the above, it is an object of the present invention to provide a regeneration system and a method capable of removing causes of jitter occurrence and, at a same time, accurately tracking fluctuations in phase difference, thus improving accuracy of clock signal regeneration.

According to a first aspect of the present invention, there is provided a clock signal regenerating system for regenerating a clock signal by feeding back a phase difference between a demodulated analog data signal and the clock signal, including:

an analog/digital converter for using the clock signal to over-sample the demodulated analog data signal, thus converting the demodulated analog data signal into a digital signal;

a data-change-direction detecting circuit for using a change in data of the demodulated analog data signal sampled at a peak position thereof by the analog/digital converter using the clock signal, to detect whether a data-change direction of the demodulated analog data signal is in an ascending direction or a descending direction;

a threshold selecting circuit for holding a threshold and also deciding whether the data of the demodulated analog data signal sampled at a zero-crossing position thereof by the analog/digital converter using the clock signal is of a positive or negative value, thereby selecting the threshold;

a phase-difference detecting circuit for comparing the data of the demodulated analog data signal sampled at the zero-crossing position thereof by the analog/digital converter using the clock signal and the threshold selected by the threshold selecting circuit, to detect data sampled in excess of the threshold as a phase difference; and a multiplier for multiplying data of a phase-difference detected by the phase-difference detecting circuit by data in the data-change direction detected by the data-change-direction detecting circuit, to feed back a resultant phase difference.

With the foregoing first aspect, only when a phase shift actually occurs between demodulated analog data and the clock signal, the phase difference is detected and fed back, to prevent a jitter from occurring to the clock signal in order to enhance accuracy of the regenerated clock signal and also largely exceed a feedback loop filter's frequency band, thus improving tracking performance against fluctuations in the phase.

In the foregoing aspect, a preferable mode is one wherein the above-mentioned analog/digital converter uses versus the above-mentioned demodulated analog data signal the clock signal having a sampling frequency twice as high as a symbol frequency, to enable sampling the demodulated analog data signal at its peak and zero-crossing positions.

That is, each time the demodulated analog data is sampled using the clock signal, the data sampled at the alternating peak and zero-crossing positions is used to enable detecting of the change in direction of the demodulated analog data, selecting of the threshold, and detecting of the phase difference.

Also, a preferable mode is one wherein, based on MSB of the demodulated analog data, the data-change-direction detecting circuit detects the data-change direction, thus permitting the threshold selecting circuit to select the threshold.

That is, since the threshold is selected depending on whether the data sampled at the zero-crossing position is lager than 0 or not, it is sufficient only to use the MSB in selection.

Furthermore, a preferable mode is one wherein, when the sampled data changes from its peak positions "−1" to "+1," the data-change-direction detecting circuit selects "+1" as the data-change direction and; when that sampled data changed from its peak positions "+1" to "−1," the data-change-direction detecting circuit selects "−1" as the data-change direction and the threshold selecting circuit holds ±ΔVth as the threshold in such a manner that when the data sampled at the zero-crossing position is positive, it selects a threshold +Vth and, if it is negative, selects a threshold −Vth; and when the data sampled at the zero-crossing position is not larger than the threshold +Vth and not smaller than the threshold −Vth, the phase-difference detecting circuit sets the phase difference to 0 and, if the data sampled at the zero-crossing position is larger than the threshold +Vth or smaller than the threshold −Vth, sets the data sampled at the zero-crossing position to the phase difference.

Thus, based on the data-change direction signal obtained by detecting the data-change direction and the positive/negative thresholds selected according to the positive/negative value of the data sampled at the zero-crossing position, the phase difference actually present between the demodulated analog data and the clock signal can be detected and used in feedback.

Furthermore, a preferable mode is one wherein, the data-change-direction detecting circuit sets the data change direction to "0" if the sampled data stayed unchanged as from peak positions "+1" to "+1" or from peak positions "−1" to "−1".

In such a manner, if no phase shift is detected between the demodulated analog data and the clock signal, no phase difference is fed back.

Also, a preferable mode is one wherein, the threshold selecting circuit selects a threshold 0 when synchronization with the clock signal is established and, after that establishment, selects the threshold +Vth or −Vth.

With this mode, when synchronization is established as mentioned above, priority is given to capture and, after that establishment, priority is given to improvement in accuracy of clock signal regeneration.

Also, according to a second aspect of the present invention, there is provided a method for regenerating a clock signal by feeding back a phase difference between demodulated analog data signal and the clock signal, including the steps of:

over-sampling the demodulated analog data signal using the clock signal, thus converting the demodulated analog data signal into a digital signal;

deciding a change in data of the demodulated analog data signal sampled at a peak position thereof by the clock signal, to detect whether the demodulated analog data signal changed in an ascending direction or a descending direction;

holding a threshold and also deciding a positive/negative sign of data of the demodulated analog data signal sampled at a zero-crossing position thereof using the clock signal, to select the threshold;

comparing the data of the demodulated analog data signal sampled at the zero-crossing position by the clock signal and a set threshold, to detect data sampled in excess of the threshold as the phase difference; and multiplying data of a detected phase difference by data in detected data-change direction, to feed back a resultant phase difference.

With the foregoing second aspect, it is possible to prevent the clock signal from jittering and to enlarge a band width of a feedback loop filter, in order to provide accurate tracking of fluctuations in phase difference, thus improving accuracy of the regenerated clock signal.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

The following will describe embodiments of the present invention with reference to the accompanying drawings.

Figure 1:
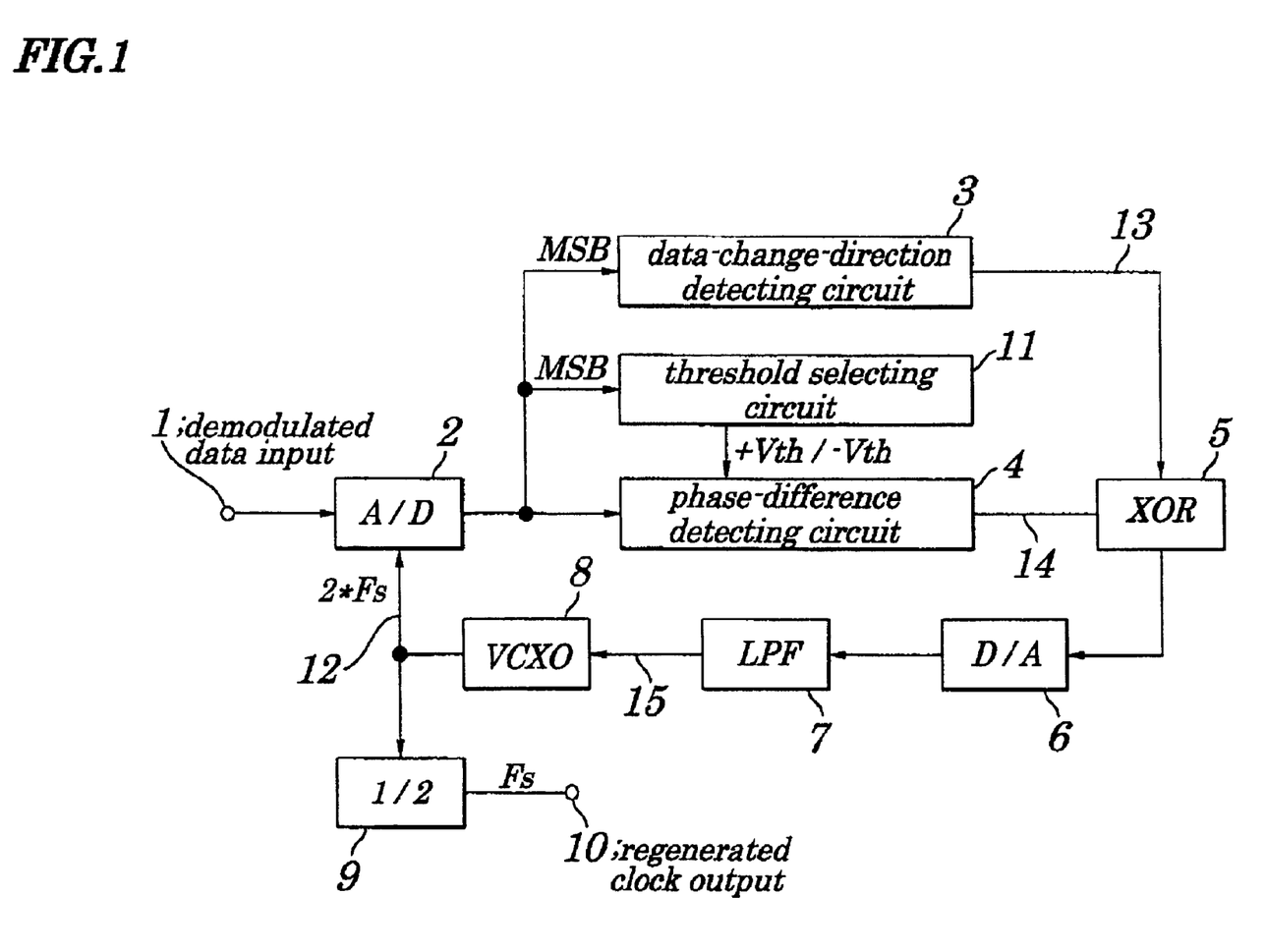
FIG. 1 is a block diagram showing a schematic configuration of a clock-signal regenerating system according to an embodiment of the present invention.

FIG. 1 differs from FIG. 3 in a respect that it has a threshold selecting circuit 11 therein. As shown in FIG. 1, to the threshold selecting circuit 11 is connected an A/D converter 2, so that an MSB converted at the A/D converter 2 may be input to the threshold selecting circuit 11 as well as to a data-change-direction detecting circuit 3 simultaneously.

The threshold selecting circuit 11 uses only the MSB of data sampled at a timing B shown in FIG. 4, to decide whether the data sampled at the timing B shown in FIG. 4 is positive or negative.

Moreover, to the threshold selecting circuit 11 is connected also a phase-difference detecting circuit 4 in such a manner that when data sampled at the timing B shown in FIG. 4 is positive, the threshold selecting circuit 11 may select +Vth as a threshold for the phase-difference detecting circuit 4 and, if it is negative, selects −Vth for the phase-difference detecting circuit 4.

Since the threshold is thus selected depending on whether the data sampled at the timing B shown in FIG. 4 is larger or smaller than 0, it is sufficient only to use the MSB of that data.

Next, an example of operations of the phase-difference detecting circuit 4 is described as follows. When demodulated analog data sampled at timing points A and B shown in FIG. 4 is input to the phase-difference detecting circuit 4, it actually uses only the data sampled at the timing B shown in FIG. 4, to detect a phase difference between a clock signal 12 and the demodulated analog data.

Figure 2A:
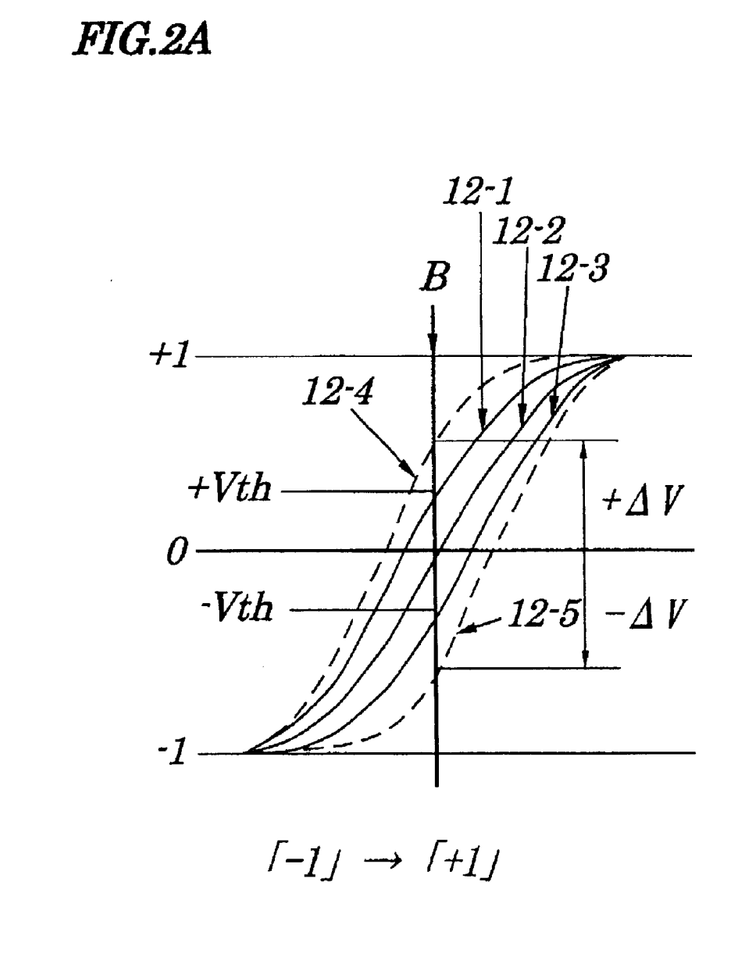
FIGS. 2A and 2B are graphs explaining specific examples of a detection method by a phase-difference detecting circuit of the same embodiment.
Figure 2B:
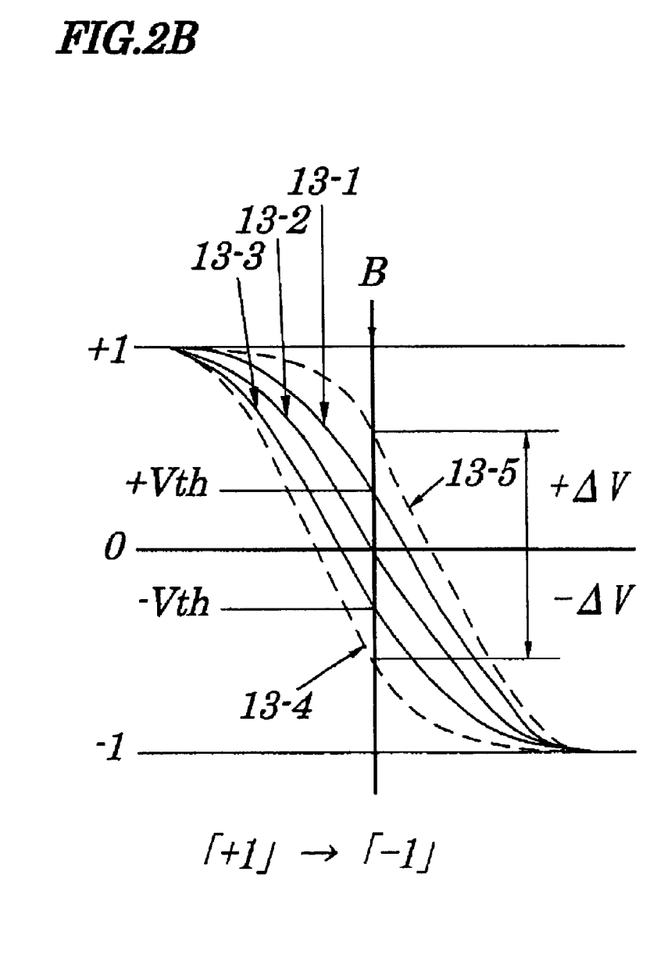

Changes in demodulated analog data of waveforms (12-1), (12-2), and (12-3) shown in FIG. 2A and changes in demodulated analog data of waveforms (13-1), (13-2), and (13-3) shown in FIG. 2B both indicate a state where phase synchronization is established between the demodulated analog data and the clock signal 12.

Changes in demodulated analog data of waveforms (12-4) and (12-5) shown in FIG. 2A and those of waveforms (13-4) and (13-5) shown in FIG. 2B both indicate the state where phase synchronization is not established between the demodulated analog data and the clock signal 12.

When demodulated analog data changed from its peak positions "−1" to "+1" as shown in FIG. 2A and if the data sampled at the timing B of the waveform (12-4) shown in FIG. 2A is positive, the above-mentioned sampled data is compared to the threshold +Vth, which is already selected by the threshold selecting circuit 11, to detect a phase-difference signal 14.

When, in this case, the sampled data is larger than the threshold +Vth, it means that the clock signal 12 lags behind the demodulated analog data in phase, so that the sampled data (+ΔV) is output as the phase-difference signal 14.

If the sampled data is not larger than the threshold +Vth, on an other hand, 0 is output as the phase-difference signal 14.

Likewise, when the data sampled at the timing B of the waveform (12-5) shown in FIG. 2A is negative, the sampled data is compared to the threshold −Vth, which is already selected by the threshold selecting circuit 11, to detect the phase-difference signal 14.

If, in this case, the sampled data is smaller than the threshold −Vth, it means that the clock signal 12 leads ahead of the demodulated analog data in phase, so that the sampled data (−ΔV) is output as the phase-difference signal 14.

If the sampled data is not smaller than the threshold −Vth, 0 is output as the phase-difference signal 14.

When demodulated analog data changed from its peak positions "+1" to "−1" as shown in FIG. 2B and if the data sampled at the timing B of the waveform (13-5) in FIG. 2B is positive, the sampled data is compared to the threshold +Vth, which is already selected by the threshold selecting circuit 11, to detect the phase-difference signal 14.

If, in this case, the sampled data (+ΔV) is larger than the threshold +Vth, it means that the clock signal 12 leads ahead of the demodulated analog data, so that −ΔV is output as the phase-difference signal 14.

If the sampled data (+ΔV) is smaller than the threshold +Vth, on an other hand, 0 is output as the phase-difference signal 14.

Likewise, when the data sampled at the timing B of the waveform (13–4) shown in FIG. 2B is negative, the sampled data is compared to the threshold −Vth, which is already selected by the threshold selecting circuit 11, to detect the phase-difference signal 14.

If, in this case, the sampled data (−ΔV) is smaller than the threshold −Vth, it means that the clock signal 12 lags behind the demodulated analog data, so that −ΔV is output as the phase-difference signal 14.

If the sampled data (−ΔV) is larger than the threshold −Vth, on an other hand, 0 is output as the phase-difference signal 14.

If the demodulated analog data stayed unchanged as from its peak positions "−1" to "−1" or from "+1" to "+1," the phase-difference detecting circuit 4 cannot detect phase difference, thus obtaining appropriate values V− and V+ respectively.

A multiplier 5 multiplies a data-change-direction signal 13 and an output of the phase-difference detecting circuit 4. This multiplication actually matches, in sign, a phase lead of the clock signal 12 (change of the demodulated analog data of the waveform (12-5)) and its phase lag (change of the demodulated If analog data of the waveform (12-4)) when the demodulated analog data changed from its peak positions "−1" to "+1" respectively with the phase lead of the clock signal 12 (change in the demodulated analog data of the waveform (13-5)) and its phase lag (change of the demodulated analog data of the waveform (13-4)) when the demodulated analog data changed from its peak positions "+1" to "−1." The table below summarizes relationships among output signals of the multiplier 5, the data-change-direction signal 13, and state of the phase-difference signal 14.

TABLE 1

| Data-Change direction | Data-Change-direction signal 13 | Waveforms of FIGS. 3A and 3B | Phase-difference signal 14 | XOR5 output | Phase of regenerated clock signal against demodulated analog data |
|---|---|---|---|---|---|
| [−1] → [+1] | +1 | 12-4 | +ΔV | +ΔV | Lagging |
| | | 12-1~3 | 0 | 0 | Agreed |
| | | 12-5 | −ΔV | −ΔV | Leading |
| [+1] → [−1] | −1 | 13-5 | +ΔV | −ΔV | Leading |
| | | 13-1~3 | 0 | 0 | Agreed |
| | | 13-4 | −ΔV | +ΔV | Lagging |
| [−1] → [−1] | 0 | — | V− | 0 | Not detected |
| [+1] → [+1] | 0 | — | V+ | 0 | Not detected |

As can be seen from the table above, when the clock signal 12 lags behind or leads ahead the demodulated analog data, the multiplier 5 provides its output signal of +ΔV or −ΔV respectively, so that irrespective of a demodulated analog data's change in direction, the lag/lead of the clock signal 12 agrees with the positive/negative sign of the output signal of the multiplier 5.

Also, if the demodulated analog data stayed unchanged, the phase-difference signal 14 obtains an appropriate value, resulting in the output signal being 0 though.

The output signal of the multiplier 5 is converted into analog signal by a D/A converter 6 and then enters a low-pass filter 7 where its high-frequency component is removed, to provide a clock-signal-phase control signal 15, which is used to control a voltage-controlled oscillator 8 so that the clock signal 12 may be synchronized with the demodulated analog data in phase.

In another embodiment of the present invention, to improve the capture properties in a case of clock signal synchronization, the threshold selecting circuit 11 prepares thresholds of 0, +Vth, and −Vth to be selected for the phase-difference detecting circuit 4.

When clock-signal synchronization is established, the threshold selecting circuit 11 selects 0 to detect the phase-difference signal 14 at all sampling timing points (changes in the demodulated analog data of the waveforms (12-1), (12-2), (12-3), (12-4), and (12-5) and those of the waveforms (13-1), (13-2), (13-3), (13-4), and (13-5)), thus improving the capture properties with priority.

After that establishment of clock-signal synchronization, the threshold selecting circuit 11 selects +Vth or −Vth as the threshold, to enhance accuracy of the phase-difference signal 14 with priority and inhibit jittering of a regenerated clock signal, thus securing a wide loop band and improving tracking performance for fluctuations in the phase-difference signal 14.

As mentioned above, according to the present invention, the phase-difference detecting circuit 4 detects sampled data sent from the A/D converter 2 as the phase-difference signal 14 using the threshold +Vth or −Vth as a reference for decision of phase sift, thus eliminating a possibility of mistake in detection of phase difference in contrast to the prior-art phase-difference detecting methods, which use the zero-crossing point (threshold 0) of the demodulated analog data as a reference.

Also, by selecting the thresholds +Vth or −Vth as a decision reference for phase-difference detection, only when the phase shift occurred between the clock signal 12 and demodulated analog data versus changes in the demodulated analog data of the waveforms (12-4) and (12-5) as shown in FIG. 2A and those of the waveforms (13-4) and (13-5) as shown in FIG. 2B, the phase-difference signal 14 can be detected to provide control in such manner as to establish phase synchronization between the clock signal 12 and the demodulated analog data, to sufficiently expand band width of the low-pass filter 7 and loop band of regenerated loop, thus improving phase-difference fluctuation tracking performance and obtaining stable regenerated clock signal with jitter suppressed even with thus expanded loop band.

It is apparent that the present invention is not limited to the above embodiments but may be changed and modified without departing from the scope and spirit of the invention.

Finally, the present application claims the priority of Japanese Patent Application No. Heill-158989 filed on Jun. 7, 1999, which is herein incorporated by reference.

What is claimed is:

1. A clock signal regenerating system for regenerating a clock signal by feeding back a phase difference between a demodulated analog data signal and said clock signal, comprising:
   an analog/digital converter for using said clock signal to over-sample said demodulated analog data signal, thus converting said demodulated analog data signal into a digital signal;
   a data-change-direction detecting circuit for using a change in data of said demodulated analog data signal sampled at a peak position thereof by said analog/digital converter using said clock signal, to detect whether a data-change direction of said demodulated analog data signal is an ascending direction or a descending direction;
   a threshold selecting circuit for holding a threshold and also deciding whether said data of said demodulated analog data signal sampled at a zero-crossing position thereof by said analog/digital converter using said clock signal is of a positive or negative value, thereby selecting said threshold;
   a phase-difference detecting circuit for comparing said data of said demodulated analog data signal sampled at said zero-crossing position thereof by said analog/digital converter using said clock signal and said threshold selected by said threshold selecting circuit, to detect data sampled in excess of said threshold as a phase difference; and
   a multiplier for multiplying data of a phase difference detected by said phase-difference detecting circuit by data of said data-change direction detected by said data-change-direction detecting circuit, to feed back a resultant said phase difference.

2. The clock signal regenerating system according to claim 1, wherein said analog/digital converter enables sampling said demodulated analog data signal by using said clock signal having a sampling frequency twice as high as a symbol frequency at said peak position and said zero-crossing position of said demodulated analog data signal.

3. The clock signal regenerating system according to claim 1, wherein said data-change-direction detecting circuit receives an MSB (Most Significant Bit) of said demodulated analog data to detect said data-change direction thereof, thus permitting said threshold selecting circuit to select said threshold.

4. The clock signal regenerating system according to claim 1, wherein:
   when said sampled data changed from peak positions "−1" to "+1" thereof, said data-change-direction detecting circuit sets "+1" as said data-change direction and, if said sampled data changed from peak positions "+1" to "−1" thereof, sets "−1" as said data-change direction;
   when said sampled data is positive, said threshold selecting circuit selects +Vth as said threshold and, if said sampled data is negative, selects −Vth as said threshold; and
   if said sampled data is not larger than said threshold +Vth and not smaller than said threshold −Vth, said phase-difference detecting circuit sets 0 as said phase difference and, if said sampled data is larger than said threshold +Vth or smaller than said threshold −Vth, sets said sampled data as said phase difference.

5. The clock signal regenerating system according to claim 4, wherein said data-change-direction detecting circuit sets "0" as said data-change direction if said sampled data stayed unchanged as from peak positions "+1" to "+1" or peak positions "−1" to "−1" thereof.

6. The clock signal regenerating system according to claim 4, wherein said threshold selecting circuit selects 0 as said threshold when said clock signal is synchronized and, after said synchronization, selects said threshold +Vth or −Vth.

7. A method for regenerating a clock signal by feeding back a phase difference between a demodulated analog data signal and said clock signal, comprising the steps of:
   a first step of over-sampling said demodulated analog data signal using said clock signal, thus converting said demodulated analog signal into a digital signal;
   a second step of deciding a change in data of said demodulated analog data signal sampled at a peak position thereof by said clock signal, to detect whether said demodulated analog data signal changed in an ascending direction or a descending direction;
   a third step of holding a threshold and also deciding a positive/negative sign of data of said demodulated analog data signal sampled at a zero-crossing position thereof using said clock signal, to select said threshold;
   a fourth step of comparing said data of said demodulated analog data signal sampled at said zero-crossing position by said clock signal and a set said threshold, to detect data sampled in excess of said threshold as said phase difference; and
   a fifth step of multiplying said data of detected phase difference by said data in detected data-change direction, to feed back a resultant said phase difference.

8. The method for regenerating a clock signal according to claim 7, wherein said first step includes a process which enables sampling said demodulated analog data signal by using said clock signal having a sampling frequency twice as high as a symbol frequency at said peak position and said zero-crossing position of said demodulated analog data signal.

9. The method for regenerating a clock signal according to claim 7, wherein said second step includes a process which receives an MSB (Most Significant Bit) of said demodulated analog data to detect said data-change direction thereof, thus permitting said threshold selecting circuit to select said threshold.

* * * * *

UNITED STATES PATENT AND TRADEMARK OFFICE
CERTIFICATE OF CORRECTION

PATENT NO. : 6,337,650 B1
DATED : January 8, 2001
INVENTOR(S) : Naoki Mitsutani

It is certified that error appears in the above-identified patent and that said Letters Patent is hereby corrected as shown below:

<u>Column 7,</u>
Line 32, delete "$-\Delta V$" insert -- $+\Delta V$ --

Signed and Sealed this

Seventh Day of May, 2002

*Attest:*

*Attesting Officer*

JAMES E. ROGAN
*Director of the United States Patent and Trademark Office*